(12) United States Patent
Healey et al.

(10) Patent No.: US 7,353,245 B2
(45) Date of Patent: Apr. 1, 2008

(54) ADAPTIVE FILTER COEFFICIENT DETERMINATION

(75) Inventors: Adam B. Healey, Newburyport, MA (US); Stephen S. Oh, Palo Alto, CA (US)

(73) Assignee: Agere Systems Inc., Allentown, PA (US)

( * ) Notice: Subject to any disclaimer, the term of this patent is extended or adjusted under 35 U.S.C. 154(b) by 935 days.

(21) Appl. No.: 10/234,900

(22) Filed: Sep. 4, 2002

(65) Prior Publication Data

US 2004/0044713 A1 Mar. 4, 2004

(51) Int. Cl.
*G06F 17/10* (2006.01)

(52) U.S. Cl. ...................................... 708/322

(58) Field of Classification Search ......... 708/300–323
See application file for complete search history.

(56) References Cited

U.S. PATENT DOCUMENTS

| | | | | |
|---|---|---|---|---|
| 4,580,275 A | * | 4/1986 | Pirani et al. ................. | 708/323 |
| 4,791,390 A | * | 12/1988 | Harris et al. ................. | 708/322 |
| 4,792,915 A | * | 12/1988 | Adams et al. ............... | 708/322 |
| 5,633,936 A | * | 5/1997 | Oh .............................. | 381/66 |
| 5,636,151 A | * | 6/1997 | Ikeda .......................... | 708/322 |
| 5,640,418 A | * | 6/1997 | Tanaka ........................ | 708/323 |
| 5,781,463 A | * | 7/1998 | Ogawa et al. .............. | 708/322 |
| 6,295,152 B1 | * | 9/2001 | Wedding ..................... | 398/209 |
| 6,337,878 B1 | * | 1/2002 | Endres et al. ............... | 708/322 |
| 6,483,867 B1 | * | 11/2002 | Mannermaa ................ | 708/322 |
| 6,804,313 B2 | * | 10/2004 | Skafidas et al. ............ | 708/320 |
| 6,826,226 B1 | * | 11/2004 | Sahlin et al. ............... | 708/323 |
| 7,006,564 B2 | * | 2/2006 | Ling et al. .................. | 708/323 |
| 7,035,328 B2 | * | 4/2006 | Shukla et al. ............... | 708/320 |
| 7,120,656 B1 | * | 10/2006 | Lam et al. ................... | 708/322 |

* cited by examiner

*Primary Examiner*—Chat C. Do
(74) *Attorney, Agent, or Firm*—Steve Mendelsohn

(57) ABSTRACT

Operation of an adaptive filter includes determining a first filter coefficient and determining a second filter coefficient based on the first filter coefficient, in one embodiment, and in another embodiment includes comparing pseudo-error counts generated for each of several time intervals and setting filter coefficients based on the comparison. Adaptive filter coefficient generating apparatus includes a pseudo-error count generator adapted to receive the output of the adaptive filter and to generate counts of pseudo-errors occurring during successive time intervals, and a filter coefficient generator generating filter coefficients for the adaptive filter in response to the pseudo-error counts.

23 Claims, 5 Drawing Sheets

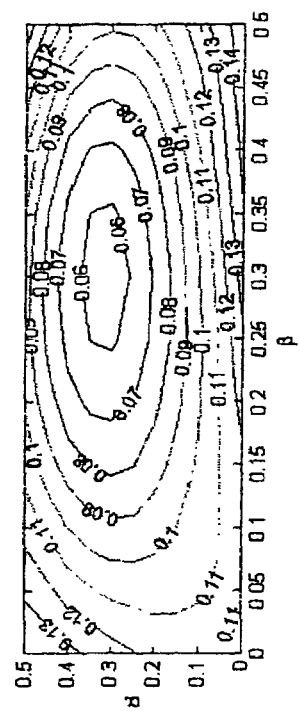
Fig. 3c
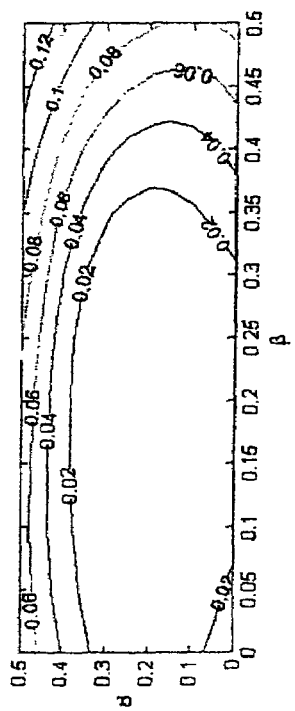
Fig. 3d
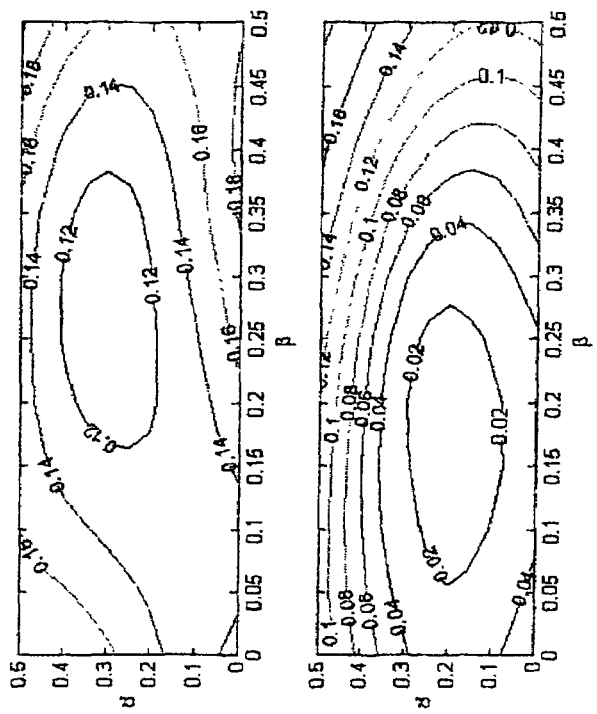
Fig. 3a
Fig. 3b

ADAPTIVE FILTER COEFFICIENT DETERMINATION

BACKGROUND OF THE INVENTION

The present invention relates to adaptive filters and, in particular, to methods and apparatus for determining filter coefficients for adaptive filters.

Data communications receivers often employ adaptive filter systems to compensate for distortion, such as inter-symbol interference ("ISI"), introduced into the data signal by the communication channel. Such systems often employ an adjustable filter including a tapped delay line where the signals appearing at the taps are scaled by a set of filter coefficients or "tap weights" and then summed. Such filters attempt to synthesize an inverse function $H^{-1}(z)$ of the communication channel transfer function $H(z)$ by appropriate selection of the filter coefficients of the adjustable filter.

Various techniques have been used to update the filter coefficients of adaptive filters, including zero-forcing processes and least-mean-square ("LMS") processes. These processes can be challenging to apply at high speeds, such as the multi-gigabit-per-second data rates that may occur in optical data communication systems. Zero-forcing processes require a history of detected symbols, and LMS processes require a history of input samples. These histories can be difficult to collect and maintain at high speeds. Moreover, these techniques require the generation of an error signal, which is correlated to the input in LMS processes and is correlated to the decision history in zero-forcing processes. These correlations can be difficult to maintain at high speeds.

BRIEF SUMMARY OF THE INVENTION

The present invention provides new signal processing methods and apparatus. In one embodiment, the present invention is an apparatus for generating filter coefficients for an adaptive filter including a pseudo-error count generator adapted to receive the output of the adaptive filter and to generate counts of pseudo-errors occurring during successive time intervals, and a filter coefficient generator generating filter coefficients for the adaptive filter in response to the pseudo-error counts.

In another embodiment, the present invention is a method of operating an adaptive filter having a plurality of filter coefficients including the steps of determining a first filter coefficient, and determining a second filter coefficient based on the first filter coefficient.

In another embodiment, the present invention is a method of setting the filter coefficients of an adaptive filter including generating a pseudo-error count for each of several time intervals, comparing the pseudo-error counts for several time intervals, and setting the filter coefficients in response to the comparison.

BRIEF DESCRIPTION OF THE DRAWINGS

The foregoing and other aspects, features, and advantages of the present invention will become more fully apparent from the following detailed description, the appended claims, and the accompanying drawings in which:

FIG. 3, comprising FIGS. 3a, 3b, 3c, and 3d, is a set of graphs illustrating examples of error characteristics that may occur in an adaptive filter of the invention.

DETAILED DESCRIPTION

Figure 1:
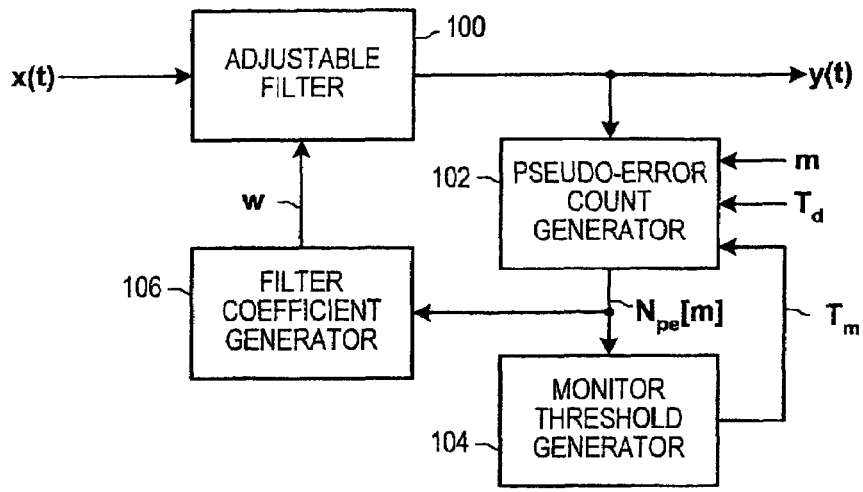
FIG. 1 is a block diagram illustrating an adaptive filter system in accordance with certain embodiments of the present invention.

FIG. 1 is a block diagram illustrating an adaptive filter system in accordance with certain embodiments of the present invention. The system includes an adjustable filter 100 that receives an input signal x(t) and generates an output signal y(t). Output signal y(t) is typically supplied to a slicer, not shown, that samples y(t), compares the samples to a decision threshold $T_d$, and generates "1" and "0" logic outputs based on the comparison. A pseudo-error count generator 102 receives filter output y(t) and determines whether y(t) when sampled is between the decision threshold $T_d$ and a monitor threshold $T_m$; such an event is referred to as a "pseudo-error." As may be seen in FIG. 5, a monitor threshold $T_m$ above decision threshold $T_d$ detects pseudo-errors occurring when a "1" is detected and provides a ones monitor threshold $T_{m1}$, and a monitor threshold $T_m$ below decision threshold $T_d$ detects pseudo-errors occurring when a "0" is detected and provides a zeroes monitor threshold $T_{m0}$. Pseudo-error count generator 102 counts the number of pseudo-errors $N_{pe}[m]$ that occur during measurement intervals m, each of which includes a number of symbol intervals n. The pseudo-error counts $N_{pe}[m]$ are supplied to filter coefficient generator 106, which generates filter coefficients w based on the pseudo-error counts $N_{pe}[m]$ and supplies the filter coefficients w to adjustable filter 100. The pseudo-error counts $N_{pe}[m]$ are also supplied to monitor threshold generator 104, which generates monitor threshold values $T_m$ based on the pseudo-error counts $N_{pe}[m]$ and supplies the monitor threshold values $T_m$ to pseudo-error count generator 102.

Figure 2:
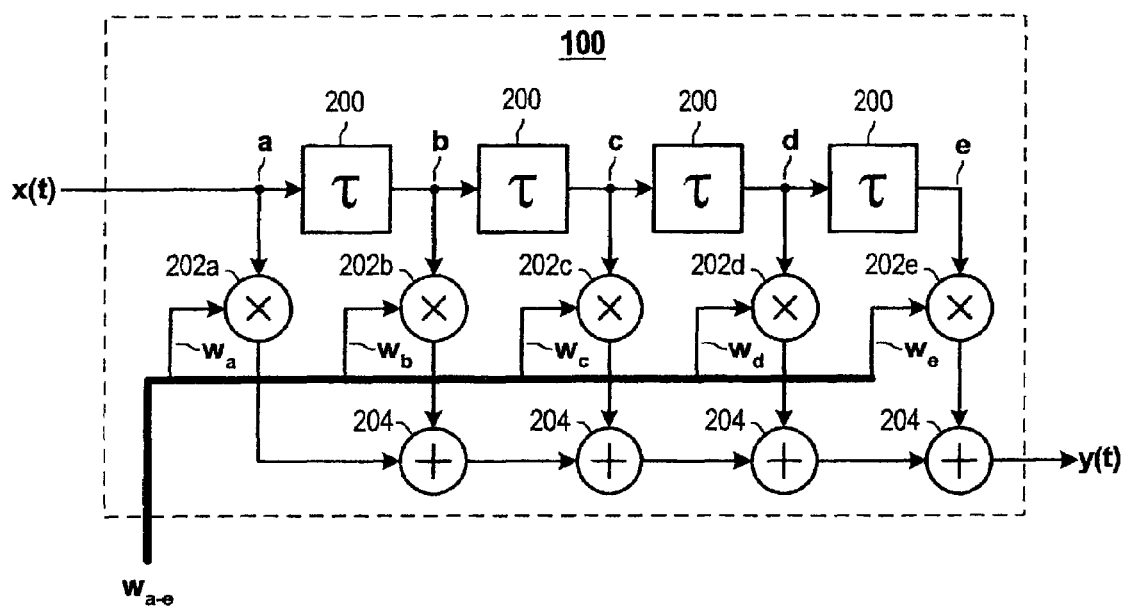
FIG. 2 is a schematic diagram illustrating an embodiment of an adjustable filter that can be used in the system of FIG. 1.

FIG. 2 is a schematic diagram illustrating an embodiment of an adjustable filter that can be used as adjustable filter 100 in the system of FIG. 1. The signals at the five taps a-e created by delay elements 200 are multiplied in multipliers 202a-202e by filter coefficients $w_{a-e}$, and the resulting signals are summed by adders 204 to provide the filter output y(t). Other embodiments of the invention might use adjustable filters having different numbers of delay elements and taps.

To compensate for communication channel distortion, various filter systems have been devised to attempt to generate an inverse function $H^{-1}(z)$ of the channel transfer function $H(z)$. Conventional processes that are used to set or update coefficients of adjustable filters, such as LMS and zero-forcing processes, attempt to measure the channel transfer function $H(z)$ and compute the channel inverse function $H^{-1}(z)$ accurately within the limits of the number of taps and their adjustability.

In accordance with one aspect of the present invention, the channel transfer function is modeled as having a particular form $H_m(z)$ which is selected to approximate the expected channel transfer function H(z). A function $H_m^{-1}(z)$ that is an exact or approximate inverse of $H_m(z)$ is determined. The filter coefficients of an adjustable filter are then set or updated in accordance with $H_m^{-1}(z)$. In some embodiments of this aspect of the present invention, the channel is assumed to exhibit both pre-cursor and post-cursor ISI, and its transfer function is modeled as:

$$H_m(z) = \beta \cdot z + 1 + \alpha \cdot z^{-1}.$$

An approximate inverse function of that model function may be selected as:

$$H_m^{-1}(z) = \ldots \beta^2 \cdot z^2 - \beta \cdot z + 1 - \alpha \cdot z^{-1} + \alpha^2 \cdot z^{-1} \ldots$$

A transfer function having the five terms of $H_m^{-1}(z)$ shown above may be implemented in a five-tap adjustable filter such as is shown in FIG. 2. A transfer function having a different number of terms of $H_m^{-1}(z)$ may be implemented in an adjustable filter having an appropriate number of taps. For instance, a seven-tap filter would enable the exponentiated filter parameters to include cubed terms ($\alpha^3$ and $\beta^3$) as well as squared and first-order terms.

The process of determining the filter coefficients to implement the above transfer function $H_m^{-1}(z)$ in a filter system may be reduced essentially to the process of determining two parameters, $\alpha$ and $\beta$. The filter coefficients for two of the taps are the parameters $\alpha$ and $\beta$ themselves; once $\alpha$ and $\beta$ are determined, two other filter coefficients, $\alpha^2$ and $\beta^2$, can be derived from $\alpha$ and $\beta$ by simple computations; and the remaining filter coefficient is unity. Simple computations to determine $\alpha^2$ from $\alpha$ and $\beta^2$ from $\beta$ may include, for instance, accessing a look-up table containing a set of parameter values and the squares of such values; look-up table access can be performed relatively easily and quickly.

FIG. 3, comprising FIGS. 3a, 3b, 3c, and 3d, is a set of graphs illustrating examples of error surfaces that may occur in an adaptive filter. The graphs of FIG. 3 were generated by computer simulation of a filter system such as that shown in FIG. 1 using bipolar signals such as those shown in FIG. 5. Each graph shows mean square error, as determined from pseudo-error counts, as a function of $\alpha$ and $\beta$. FIGS. 3a and 3b represent the error with $T_m = \pm 0.6$ and FIGS. 3c and 3d represent the error with $T_m = \pm 0.5$. FIGS. 3a and 3c represent the error when detecting ones, and FIGS. 3b and 3d represent the error when detecting zeroes. The graphs of FIG. 3 show contours of constant error. It will be noted that each graph shows only a single minimum; there are no local or false minima. Applicants' simulations of a variety of conditions also indicated the absence of local or false minima.

In accordance with another aspect of the present invention, the determination of filter parameters or filter coefficients in some embodiments of the present invention includes a gradient search. A gradient search involves repetitively changing a parameter to which a system is responsive and then determining the response of the system, wherein the parameter change is determined based on whether the previous parameter change caused the system response to become closer to or farther from a response of interest. Because the error function of $\alpha$ and $\beta$ has a single minimum, as described above, a gradient search can be used to determine $\alpha$ and $\beta$ without the search process converging on a false or local minimum.

In accordance with another aspect of the present invention, in some embodiments pseudo-error counts are generated, and a gradient search to determine filter parameters or filter coefficients is performed using pseudo-error counts as the monitored system response driving the gradient search.

Figure 4:
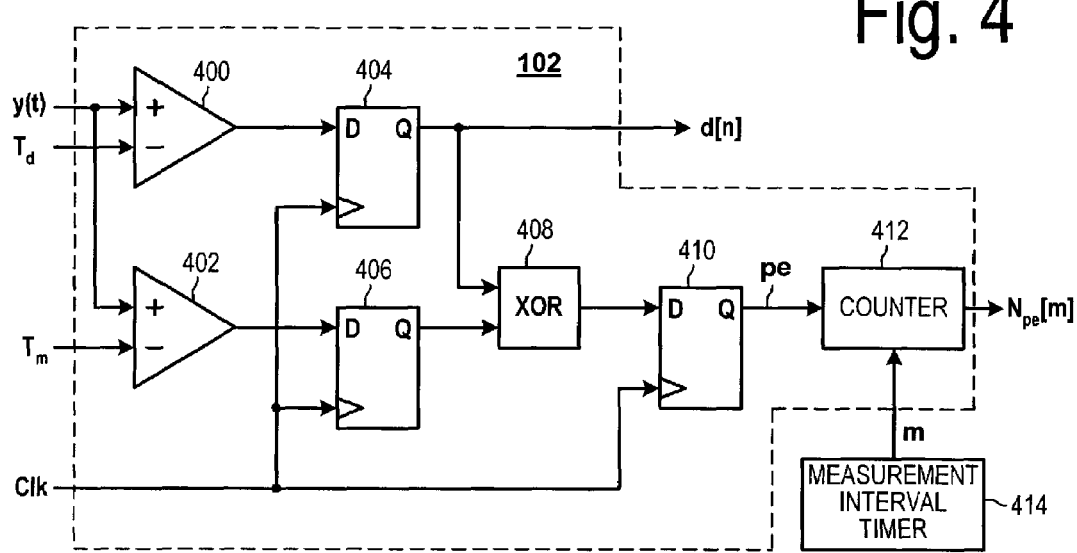
FIG. 4 is a schematic diagram illustrating a pseudo-error count generator in accordance with an embodiment of the present invention.
Figure 5:
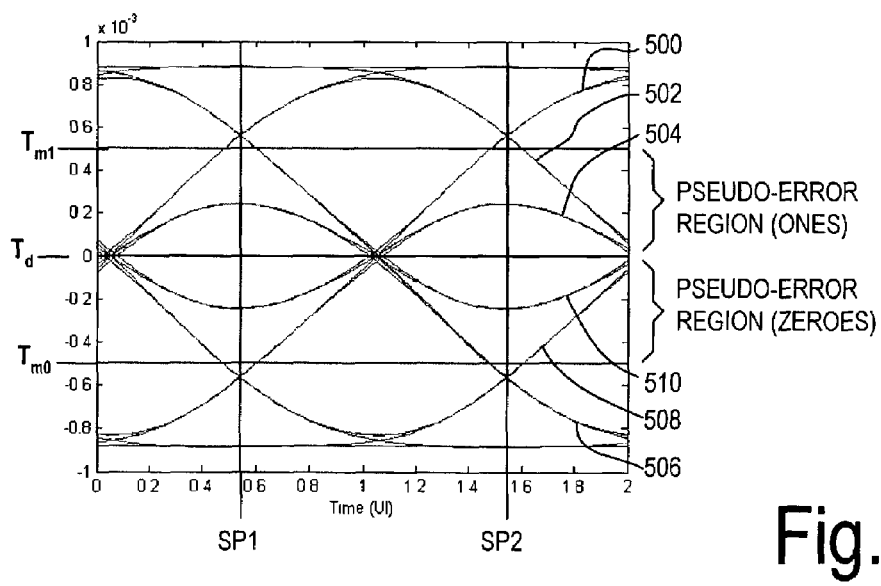
FIG. 5 is a graph showing waveforms that may be helpful in understanding the operation of the pseudo-error count generator of FIG. 4.

FIG. 4 is a schematic diagram illustrating a pseudo-error count generator in accordance with an embodiment of the present invention, and FIG. 5 is a graph showing waveforms that may be helpful in understanding the operation of the pseudo-error count generator of FIG. 4. With reference to FIG. 5, several signal waveforms are shown over two unit intervals ("UI") of time, with a sampling point indicated in each unit interval. The graph shows the amplitude levels of a decision threshold $T_d$, a ones monitor threshold $T_{m1}$ above $T_d$, and a zeroes monitor threshold $T_{m0}$ below $T_d$. At the second sampling point SP2, waveforms 500 and 502 are above decision threshold $T_d$ and would be determined to represent ones in this unit intervals; they are also above ones monitor threshold $T_{m1}$ and would be determined not to represent pseudo-errors occurring in this unit interval. At the second sampling point SP2, waveform 504 is above decision threshold $T_d$ and would be determined to represent a one in this unit interval; however, it is below ones monitor threshold $T_{m1}$ and would be determined to represent a pseudo-error occurring in this unit interval. At the sampling point SP2, waveforms 506 and 508 are below decision threshold $T_d$ and would be determined to represent zeroes in this unit interval; they are also below zeroes monitor threshold $T_{m0}$ and would be determined not to represent pseudo-errors occurring in this unit interval. At the sampling point SP2, waveform 510 is below decision threshold $T_d$ and would be determined to represent a zero in this unit interval; however, it is above zeroes monitor threshold $T_{m0}$ and would be determined to represent a pseudo-error occurring in this unit interval. Thus, pseudo-errors occur when the signal level at the sampling time is in the indicated regions between the decision threshold $T_d$ and a monitor threshold $T_m$.

The system of FIG. 4 detects pseudo-errors and counts the number of pseudo-errors occurring in each measurement interval m. The output of comparator 400 is high when input signal y(t) is higher than decision threshold $T_d$, and the output of comparator 402 is high when input signal y(t) is higher than monitor threshold $T_m$. The output of comparator 400 is low when input signal y(t) is lower than decision threshold $T_d$, and the output of comparator 402 is low when input signal y(t) is lower than monitor threshold $T_m$. Flip-flops 404 and 406 latch the output states of comparator 400 and comparator 402, respectively, at their Q outputs when clocked by clock signal Clk. The output d[n] of flip-flop 404 is the symbol determined for y(t) in the unit interval.

The outputs of flip-flops 404 and 406 are supplied to exclusive-OR ("XOR") gate 408, the output of which is high when its inputs are different, and low otherwise. If $T_m$ is set higher than $T_d$, so as to provide as a ones monitor threshold $T_{m1}$, the output of XOR gate 408 will be high when a ones pseudo-error occurs (i.e., a pseudo-error occurring when a one is detected) and low otherwise. If $T_m$ is set lower than $T_d$, so as to provide as a zeroes monitor threshold $T_{m0}$, the output of XOR gate 408 will be high when a zeroes pseudo-error occurs and low otherwise. The output of XOR gate 408 is supplied to flip-flop 410 which latches the output state of XOR gate 408 at its Q output when clocked by clock signal Clk. A high signal at the Q output of flip-flop 410 represents the occurrence of a pseudo-error ("pe") occurring during the unit interval. The pseudo-error signal pe is supplied to the input of counter 412, which counts the number of pseudo-errors occurring during a measurement interval m established by measurement interval timer 414 and outputs the number of pseudo-errors counted in the measurement interval as $N_{pe}[m]$.

Although only ones pseudo-errors or only zeroes pseudo-errors might be counted in embodiments of the invention, it is desirable to count both ones pseudo-errors and zeroes pseudo-errors. This may be done using the pseudo-error count generator of FIG. 4 by setting monitor threshold $T_m$ to a ones monitor threshold $T_{m1}$ during time intervals when ones pseudo-errors are to be counted, and setting monitor threshold $T_m$ to a zeroes monitor threshold $T_{m0}$ during time intervals when zeroes pseudo-errors are to be counted. Alternatively, the pseudo-error count generator of FIG. 4 could be duplicated, with one generator counting ones pseudo-errors and the other generator counting zeroes pseudo-errors. Another alternative is to duplicate elements 402, 406, 408, and 410 and supply one of the comparators 402 with a ones monitor threshold $T_{m1}$ and the other with a zeroes monitor threshold $T_{m0}$; the pe signals from each flip-flop 410 could be supplied to separate counters to accumulate separate zeroes and ones pseudo-error counts, or they could be OR'd and then supplied to the input of counter 412 to accumulate a combined count of both ones pseudo-errors and zeroes pseudo-errors. If separate zeroes pseudo-error counts and ones pseudo-error counts are obtained, differences between them can be used to adjust decision threshold $T_d$.

In order to perform a gradient search, counts of pseudo-error occurring in successive measurement intervals are maintained. In a preferred embodiment of the invention, a quantity representing the direction in which a filter parameter is to be changed, referred to herein as a "pseudo-gradient," is determined based on pseudo-error counts from successive measurement intervals, and a filter parameter change is determined based on the pseudo-gradient. More particularly, the pseudo-gradient is determined as $$\Delta[m] = -\text{sign}(N_{pe}[m] - N_{pe}[m-1]) \cdot \Delta[m-1], \text{ where}$$

$\Delta[m]$ is the new pseudo-gradient that is determined based on the pseudo-error count in the most recent measurement interval m;
$\Delta[m-1]$ is the previously-determined pseudo-gradient, determined after the previous measurement interval m−1;
$N_{pe}[m]$ is the pseudo-error count in the most recent measurement interval m; and
$N_{pe}[m-1]$ is the pseudo-error count in the previous measurement interval m−1.

The determination of pseudo-gradient $\Delta[m]$ may be summarized in the following table:

| sign ($N_{pe}[m] - N_{pe}[m-1]$) | $\Delta[m-1]$ | $\Delta[m]$ |
|---|---|---|
| −1 | −1 | −1 |
| −1 | +1 | +1 |
| +1 | −1 | +1 |
| +1 | +1 | −1 |

The filter parameters are updated based on the determined pseudo-gradient in accordance with:

$$\alpha[m] = \alpha[m-1] + \mu \cdot \Delta[m], \text{ and } \beta[m] = \beta[m-1] + \mu \cdot \Delta[m],$$

which has the effect of increasing α or β by μ if $\Delta[m]$ is +1, and decreasing α or β by μ if $\Delta[m]$ is −1. The value of μ, the parameter step size in the gradient search, is a matter of design choice, and its selection represents a compromise. The larger the parameter step size μ is, the faster the gradient search converges toward a stable value of α or β, but the larger is the possible difference between the value of α or β determined in the gradient search and the optimum value of α or β. Moreover, a gradient search process that converges may "hunt" around the optimum value as it repeatedly changes a parameter value and responds to the resulting effect. This results in parameter jitter having a magnitude on the order of the step size. If the communication channel does not change rapidly, a small value of μ providing slower convergence but greater accuracy upon convergence may be desirable. If both rapid convergence and accuracy are desired, μ may be made variable and dependent on the magnitude of the difference in pseudo-error counts between successive measurement intervals, so that larger count differences provide larger step sizes and faster initial convergence, and smaller count differences provide smaller step sizes and more accurate final convergence.

Figure 6:
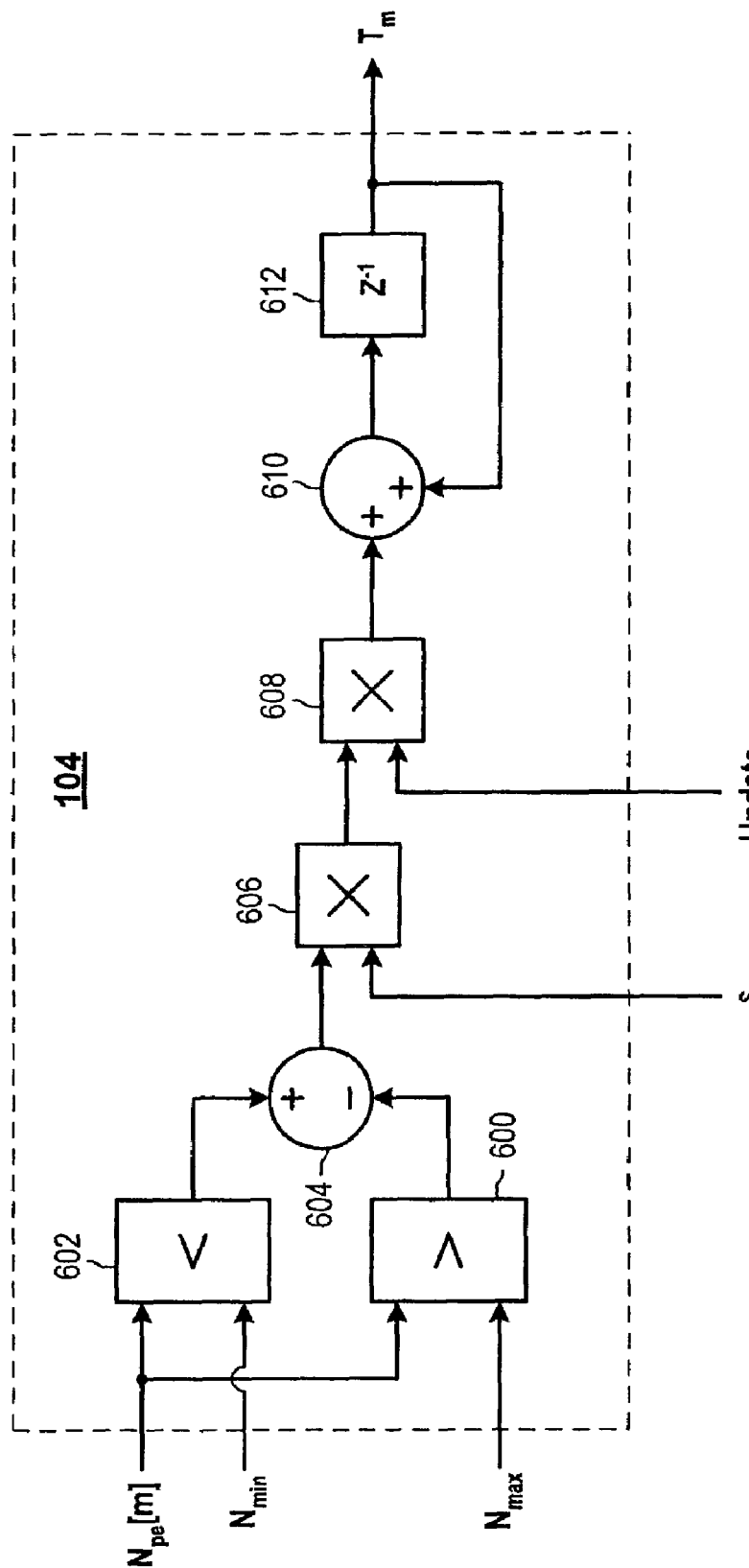
FIG. 6 is a schematic diagram of an embodiment of a monitor threshold generator in accordance with the present invention.

The gradient search for filter parameters using pseudo-error counts to drive the search tends to drive the pseudo-error count toward zero as the filter parameters approach their optimum values. However, a low value of pseudo-error count makes detection of changes, and feedback control based on such changes, more difficult. In accordance with another aspect of the present invention, monitor threshold values are adjusted in a manner tending to maintain the pseudo-error counts in successive measurement intervals near a target value. FIG. 6 illustrates a monitor threshold generator 104 in accordance with this aspect of the invention.

FIG. 6 is a schematic diagram of an embodiment of a monitor threshold generator in accordance with the present invention. In the system of FIG. 6, the target value of pseudo-error count is defined by a range between a minimum value $N_{min}$ and a maximum value $N_{max}$ that are provided as inputs, such as stored values or inputs from a control circuit. These count target values $N_{min}$ and $N_{max}$ are compared to the pseudo-error count $N_{pe}[m]$ by comparators 600 and 602. The output of comparator 600 is a "1" if the pseudo-error count exceeds the target maximum value, and a "0" if the pseudo-error count does not exceed the target maximum value. The output of comparator 602 is a "1" if the pseudo-error count is less than the target minimum value, and a "0" if the pseudo-error count is not less than the target minimum value. The output of adder 604 is the difference of the outputs of comparators 600 and 602. The output of adder 604 will assume one of three logic levels:−1, if $N_{pe}[m] > N_{max}$; 0, if $N_{min}$ $N_{pe}[m]$ $N_{max}$; and 1, if $N_{pe}[m] < N_{min}$. These logic levels correspond to a decrease, no change, and an increase, respectively, in monitor threshold $T_m$. Multiplier 606 multiplies the output of adder 604 by a threshold adjustment step size δ, and so the output of multiplier 606 will assume the value of −δ, 0, or +δ, respectively. Multiplier 608 multiplies the output of multiplier 606 by a threshold update signal "Update", which is normally 0 and is set to 1 when a monitor threshold is to be adjusted or updated. Strobing "Update" with a 1 passes the value (−δ, 0, or +δ) of the output of multiplier 606 to one input of adder 610, the other input of which is the current monitor threshold $T_m$. Thus the output of adder 610 is the current monitor threshold $T_m$ increased or decreased by step size δ or left unchanged, depending on whether the pseudo-error count is below, above, or within the target range. Accumulator or delay element 612 passes the output of adder 610 through to provide an updated monitor threshold $T_m$ after a delay interval, although alternatively the output of adder 610 could be used to provide $T_m$. Increasing a monitor threshold tends to increase the number of pseudo-errors that will occur; use of the monitor threshold generator of FIG. 6 in the system of FIG. 1 provides negative feedback tending to keep the pseudo-error counts within the target range.

In the system of FIG. 1, filter coefficient generator 106 and monitor threshold generator 104 operate together as follows. Adjustment of adjustable filter 100 by filter coefficient generator 106 tends to open the "eye" and drive the pseudo-error count toward zero; the monitor threshold generator 104 responds by moving the monitor thresholds farther from the decision threshold so as to try to maintain the target pseudo-error count. These competing effects tend to open the eye to the maximum extent possible and thereby optimize performance.

Figure 7:
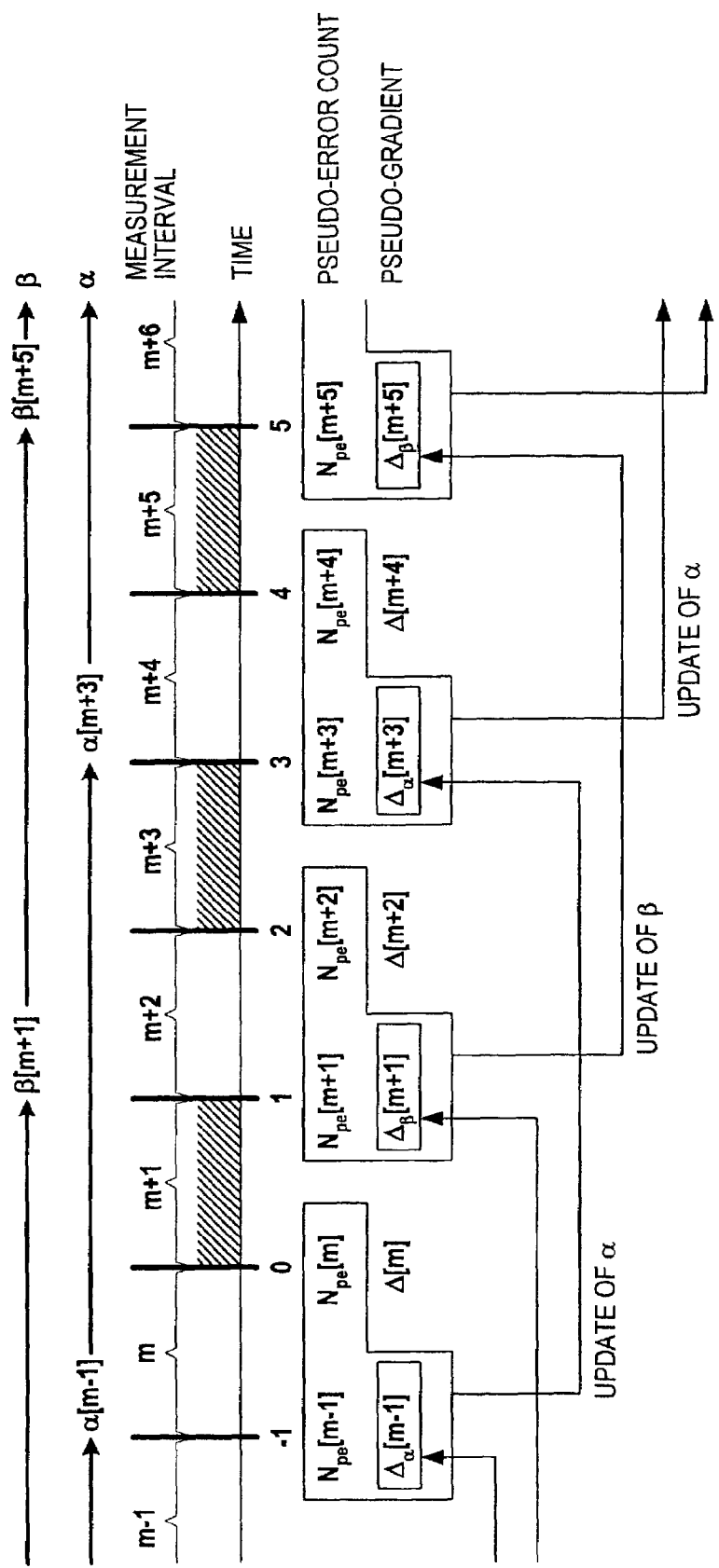
FIG. 7 is a timing diagram illustrating a method of adjusting filter parameters.

Adjustment of filter parameters $\alpha$ and $\beta$ is desirably not performed simultaneously, so that changes in pseudo-error count during a gradient search can be attributed solely to either $\alpha$ or $\beta$. Because $\alpha$ and $\beta$ are independent, they can be updated independently and still converge on their minima. FIG. 7 illustrates a method of adjusting the filter parameters independently.

FIG. 7 is a timing diagram showing several measurement intervals. The time scale is in units of the measurement interval m, and heavy vertical lines are shown at times $-1$, $0, 1, 2, \ldots$ Such lines may represent, for example, the times at which the signal m generated by measurement interval timer 414 changes state to cause the count $N_{pe}[m]$ accumulated during the preceding measurement interval to be stored for use in computing filter parameters. The expressions involving m correlate with the indicated times when m=0; thus the $(m+1)^{th}$ or first measurement interval ends at t=1, the $(m+2)^{th}$ or second measurement interval ends at t=2, and so on. The pseudo-error count accumulated during a measurement interval is indicated below the ending time of the measurement interval. The new pseudo-gradient which is calculated based on previous pseudo-error count and pseudo-gradient values, and which is used to calculate a new filter parameter to be applied, is indicated below the time at which the new filter parameter is applied. The filter parameters $\alpha$ and $\beta$ are indicated along lines at the top of FIG. 7; a value of $\alpha$ or $\beta$ is indicated immediately after the time at which it is applied, and an arrow extending to the right of a value indicates the length of time during which that value is applied.

At $t=-1$, a value of $\alpha$, $\alpha[m-1]$, calculated using a pseudo-gradient value $\Delta_\alpha[m-1]$ that was previously determined is applied, and filter coefficients w determined using $\alpha[m-1]$ are supplied to adjustable filter 100. At $t=-1$, a pseudo-error count $N_{pe}[m-1]$ is determined for the measurement interval $[m-1]$, and at $t=0$, a pseudo-error count $N_{pe}[m]$ is determined for the measurement interval $[m]$. As indicated by their grouping, and as previously described, the pseudo-error counts $N_{pe}[m-1]$ and $N_{pe}[m]$ and the pseudo-gradient $\Delta_\alpha[m-1]$ are used to compute a new pseudo-gradient having a value determined as $-\text{sign}\,(N_{pe}[m]-N_{pe}[m-1])\cdot\Delta[m-1]$, and that new pseudo-gradient is used to compute a new filter parameter $\alpha$ determined as $\alpha[m-1]+\mu\cdot\Delta[m]$. However, the new value is not immediately applied at $t=0$; instead, it is applied at $t=3$, three measurement intervals later. Thus, the expressions describing the update process of FIG. 7 for updating $\alpha$ are:

$$\Delta_\alpha[m+3]=-\text{sign}(N_{pe}[m]-N_{pe}[m-1])\cdot\Delta_\alpha[m-1], \text{ and}$$
$$\alpha[m+3]=\alpha[m-1]+\mu\cdot\Delta_\alpha[m+3].$$

The process is used to update $\beta$ as well as $\alpha$. Thus, as shown in FIG. 7, the value of $\beta$ applied at $t=1$ is updated and the updated value is applied at $t=5$ in accordance with:

$$\Delta_\beta[m+5]=-\text{sign}(N_{pe}[m+2]-N_{pe}[m+1])\cdot\Delta_\beta[m+1], \text{ and}$$
$$\beta[m+5]=\beta[m+1]+\mu\cdot\Delta_\beta[m+5].$$

It will be seen in FIG. 7 that the pseudo-error counts used to determine a new value of $\alpha$ are obtained from a measurement interval in which the present value of $\alpha$ was applied and a measurement interval in which the previous value of $\alpha$ was applied, and that the value of $\beta$ is the same in both intervals. Likewise, the value of $\alpha$ is the same in the two measurement intervals in which pseudo-error counts are obtained using present and previous values of $\beta$. Thus, the updating of each filter parameter is performed separately from the updating of the other filter parameter, which is held constant so as to avoid interaction of filter parameter adjustments. The hatched areas in FIG. 7 represent measurement intervals in which the filter parameters remain unchanged with respect to the previous measurement interval. Measurement interval m is generally a matter of design choice, but should be selected to include a number of symbol intervals in which a reasonable amount of pseudo-error information can be obtained. The measurement interval over which pseudo-errors are counted, and the frequency of updating, need not be the same for updating monitor thresholds and for updating filter coefficients.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments mutually exclusive of other embodiments.

It will be further understood that various changes in the details, materials, and arrangements of the parts which have been described and illustrated in order to explain the nature of this invention may be made by those skilled in the art without departing from the scope of the invention as expressed in the following claims.

What is claimed is:

1. A method of filtering a current input communication signal using an adaptive filter of a communications receiver the adaptive filter having a plurality of filter coefficients, the method comprising the steps of:
   (a) determining a current value for a first filter coefficient;
   (b) determining a current value for a second filter coefficient based on the current value for the first filter coefficient; and
   (c) filtering the current input communication signal by inputting the current input communication signal to the adaptive filter to generate a current filtered output communication signal using the current values of the first and second filter coefficients, wherein step (a) comprises the steps of:
      (a1) generating a pseudo-error count for each of several time intervals;
      (a2) comparing the pseudo-error counts with one or more count targets for several time intervals; and
      (a3) determining the filter coefficients in response to the comparison of step (a2).

2. The invention of claim 1, wherein step (b) comprises exponentiating the first filter coefficient.

3. The invention of claim 2, wherein step (b) comprises squaring the first filter coefficient.

4. The invention of claim 1, wherein step (b) comprises accessing a look-up table.

5. The invention of claim 1, wherein step (b) comprises accessing an exponentiated value of the first filter coefficient in a look-up table.

6. The invention of claim 1, wherein:
the first filter coefficient corresponds to a first tap of the adaptive filter;
the second filter coefficient corresponds to a second tap of the adaptive filter, different from the first tap; and
step (c) comprises applying (1) the first filter coefficient to the first tap of the adaptive filter and (2) the second filter coefficient to the second tap of the adaptive filter to generate the current filtered output communication signal from the current input communication signal.

7. The invention of claim 6, wherein application of the first filter coefficient to the first tap of the adaptive filter is concurrent with application of the second filter coefficient to the second tap of the adaptive filter.

8. A method of filtering a current input communication signal using an adaptive filter of a communications receiver, the method comprising the steps of:
(a) generating a pseudo-error count for each of several time intervals, wherein the occurrence of a pseudo-error is determined when the adaptive filter output falls between two different thresholds;
(b) comparing the pseudo-error counts with one or more count targets for several time intervals;
(c) setting the filter coefficients in response to the comparison of step (b); and
(d) filtering the input communication signal by inputting the input communication signal to the adaptive filter to generate a filtered output communication signal using the filter coefficients set in step (c).

9. The invention of claim 8, wherein step (c) is performed in a manner tending to decrease the pseudo-error counts.

10. The invention of claim 9, wherein step (c) includes a gradient search process.

11. The invention of claim 8, wherein step (c) includes updating a plurality of filter coefficients.

12. The invention of claim 11, wherein filter coefficients are not updated simultaneously.

13. The invention of claim 8, wherein step (a) includes:
(a1) determining the occurrence of a pseudo-error when the adaptive filter output falls between a decision threshold and a monitor threshold;
(a2) comparing a pseudo-error count with a count target; and
(a3) setting the monitor threshold in response to the comparison of step (a2).

14. The invention of claim 13, wherein the monitor threshold is set in step (a3) in a manner tending to maintain the pseudo-error counts near the count target.

15. The invention of claim 8, wherein step (c) includes:
(c1) determining a first filter coefficient; and
(c2) determining a second filter coefficient based on the first filter coefficient.

16. The invention of claim 8, wherein step (a) includes:
(a1) determining the occurrence of a pseudo-error when the adaptive filter output falls between a decision threshold and a monitor threshold;
(a2) comparing a pseudo-error count with a count target; and
(a3) setting the monitor threshold in response to the comparison of step (a2) in a manner tending to maintain the pseudo-error counts near the count target, and wherein step (c) includes:
(c1) determining a first filter coefficient using a gradient search process; and
(c2) determining a second filter coefficient based on the first filter coefficient.

17. A communications receiver comprising:
an adaptive filter adapted to filter an input communication signal to generate a filtered output communication signal using filter coefficients;
a pseudo-error count generator adapted to receive the filtered output communication signal of the adaptive filter and to generate counts of pseudo-errors occurring during successive time intervals, wherein the pseudo-error count generator is adapted to determine the occurrence of a pseudo-error when the filtered output communication signal falls between two different thresholds; and
a filter coefficient generator adapted to generate the filter coefficients for the adaptive filter in response to the pseudo-error counts.

18. The invention of claim 17, wherein the filter coefficient generator generates the filter coefficients in a manner tending to decrease the pseudo-error counts.

19. The invention of claim 17, wherein the filter coefficient generator generates the filter coefficients using a gradient search.

20. The invention of claim 17, wherein the pseudo-error count generator determines the occurrence of a pseudo-error when the filtered output communication signal falls between a decision threshold and a monitor threshold, further comprising a monitor threshold generator that compares the pseudo-error count with a count target and generates the monitor threshold in response to the comparison.

21. The invention of claim 20, wherein the monitor threshold generator generates the monitor threshold in a manner tending to maintain the pseudo-error counts near the count target.

22. The invention of claim 17, wherein the filter coefficient generator generates a first filter coefficient, and generates a second filter coefficient based on the first filter coefficient.

23. The invention of claim 17, wherein the filter coefficient generator generates a first filter coefficient using a gradient search and generates a second filter coefficient based on the first filter coefficient, and wherein the pseudo-error count generator determines the occurrence of a pseudo-error when the filtered output communication signal falls between a decision threshold and a monitor threshold, further comprising a monitor threshold generator that compares the pseudo-error count with a count target and generates the monitor threshold in response to the comparison in a manner tending to maintain the pseudo-error counts near the count target.

* * * * *